(12) United States Patent
Fujii

(10) Patent No.: US 8,098,496 B2
(45) Date of Patent: Jan. 17, 2012

(54) WIRING BOARD FOR SEMICONDUCTOR DEVICE

(75) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 395 days.

(21) Appl. No.: 12/348,132

(22) Filed: Jan. 2, 2009

(65) Prior Publication Data
US 2009/0178836 A1    Jul. 16, 2009

(30) Foreign Application Priority Data
Jan. 15, 2008 (JP) .................... 2008-005275

(51) Int. Cl.
*H05K 7/10* (2006.01)
(52) U.S. Cl. ........................................ 361/767
(58) Field of Classification Search ............ 361/767, 361/760–761, 771, 782–783, 752; 174/262, 174/250; 257/638, 698, 737; 439/67–70
See application file for complete search history.

(56) References Cited

U.S. PATENT DOCUMENTS

| | | | |
|---|---|---|---|
| 6,441,316 B1 | 8/2002 | Kusui | |
| 6,489,572 B2 * | 12/2002 | Ho et al. | 174/259 |
| 7,719,853 B2 * | 5/2010 | Shih | 361/767 |
| 7,868,443 B2 * | 1/2011 | Kwon et al. | 257/686 |
| 2006/0152910 A1 * | 7/2006 | Stalder et al. | 361/767 |
| 2009/0027864 A1 * | 1/2009 | Cho et al. | 361/767 |
| 2009/0290316 A1 * | 11/2009 | Kariya | 361/767 |

FOREIGN PATENT DOCUMENTS

| | | |
|---|---|---|
| JP | 58-053880 | 3/1983 |
| JP | 2001-068836 | 3/2001 |
| JP | 2001-237529 | 8/2001 |
| JP | 2002-299780 | 10/2002 |
| JP | 2004-128290 | 4/2004 |

OTHER PUBLICATIONS

Japanese Official Action—2008-005275—Aug. 17, 2011.

* cited by examiner

*Primary Examiner* — Jean F Duverne
(74) *Attorney, Agent, or Firm* — Young & Thompson

(57) ABSTRACT

A wiring board for a semiconductor device has a substrate, a solder resist provided on the substrate, a land, and a wiring line. The solder resist is not in contact with the land, and an end portion of the wiring line is arranged such that, when a solder ball is not provided, the end portion of the wiring line and the land face each other with a distance therebetween.

20 Claims, 18 Drawing Sheets

WIRING BOARD FOR SEMICONDUCTOR DEVICE

This application is based upon and claims the benefit of priority from Japanese patent application No. 2008-5275, filed on Jan. 15, 2008, the disclosure of which is incorporated herein in its entirety by reference.

BACKGROUND OF THE INVENTION

1. Field of the Invention

The present invention mainly relates to a wiring board for a semiconductor device for mounting semiconductor elements thereon.

2. Description of the Related Art

In recent years, the size reduction and performance enhancement of electronic equipment have pushed the increase in degree of integration and size reduction of semiconductor elements used in the electronic equipment.

This is achieved, for example, by a connection structure for connection between a substrate and semiconductor elements, in which a conductor pedestal called "land" is provided on the substrate so that a contact member such as a solder ball provided on the land is connected to another substrate or the like.

When employing this structure, the sizes of the land and the contact member must be reduced in order to increase the degree of integration and the number of terminals of the semiconductor elements.

However, the size reduction of the land and contact member inevitably involves the reduction of the contact area, which possibly deteriorates the bonding strength.

Therefore, a structure is required to prevent the deterioration in the bonding strength due to the size reduction of the land and the contact member.

A NSMD (Non Solder Mask Defined) structure is one of such structures to prevent the deterioration in the bonding strength between the land and the contact member.

The NSMD structure is a structure in which a gap is provided between the land and a solder resist, so that the contact member is in contact not only with the top face of the land but also the side faces of the land, whereby the bonding strength between the land and the contact member is enhanced.

However, even in the NSMD structure, a neck portion where a wiring line is led out from the land, that is, a connection portion connected with the wiring line assumes a SMD (Solder Mask Defined) structure covered with a solder resist.

Therefore, the NSMD structure often suffers fracture of the contact member which progresses from the SMD portion (neck) where the connection with the contact member is weak, and thus a structure to prevent such fracture is sometimes required.

The structure to prevent the fracture is for example achieved by a structure in which an annular support portion is provided around the terminal portion of the land and a plurality of joining portions are used to connect between the terminal portion and the support portion.

For example, Japanese Laid-Open Patent Publication No. 2003-243813 (Patent Document 1) shows, in FIG. 1, a terminal structure for a BGA (Ball Grid Array) semiconductor device in which a land for soldering a ball has a terminal portion, a support portion arranged in the vicinity of the outer periphery of the terminal portion, and a joining portion for joining the terminal portion with the support portion, and an insulating layer is provided on the substrate to cover the support portion while leaving the terminal portion exposed, so that the ball is soldered to the terminal portion with the solder extending over the surface of the terminal portion and the edge.

SUMMARY

In such a structure, the land is connected by a plurality of joining portions from the support portion, which improves the bond strength between the wiring board and the land. However, the land is connected by means of the joining portions, and the bases of these joining portions assume a SMD structure.

This may result in a problem that stress generated in the semiconductor device causes fracture of the solder balls to progress from the SMD part where the joint with the solder is weak, and such fracture of the solder balls lead to deterioration in reliability of secondary packaging of the semiconductor device.

Further, in the structure as described above, the support portion is formed around the terminal portion of each land, which results in increased pitch between the lands and may lead to increased size of the wiring board.

Further, as for a multiple wiring board in which wiring must be laid between lands, the disadvantages will become more significant. Specifically, the size of the wiring board is increased, and hence the size of the semiconductor device is also increased.

The present invention seeks to solve one or more of the above problems, or to improve upon those problems at least in part.

In one embodiment, there is provided a wiring board for a semiconductor device comprising:

a substrate;

a land arranged on the substrate to mount a contact member thereon;

a wiring line arranged on the substrate and electrically connected to the contact member; and a solder resist provided to cover a surface of the substrate and not to be in contact with the land, the wiring line being spaced apart from the land.

BRIEF DESCRIPTION OF THE DRAWING

The above features and advantages of the present invention will be more apparent from the following description of certain preferred embodiments taken in conjunction with the accompanying drawings, in which.

DETAILED DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the invention will be described in detail with reference to the accompanying drawings.

Figure 1:
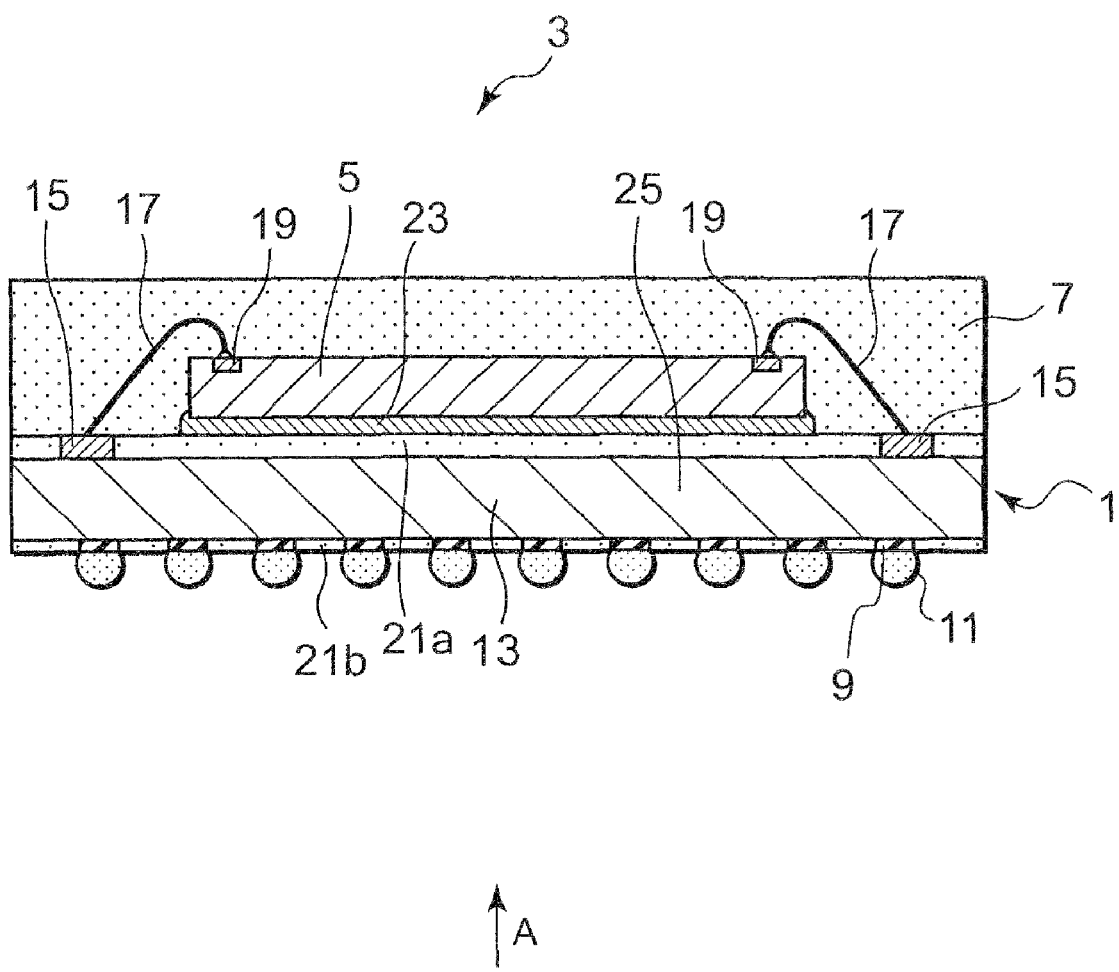
FIG. 1 is a cross-sectional view showing a semiconductor device 3.
Figure 2:
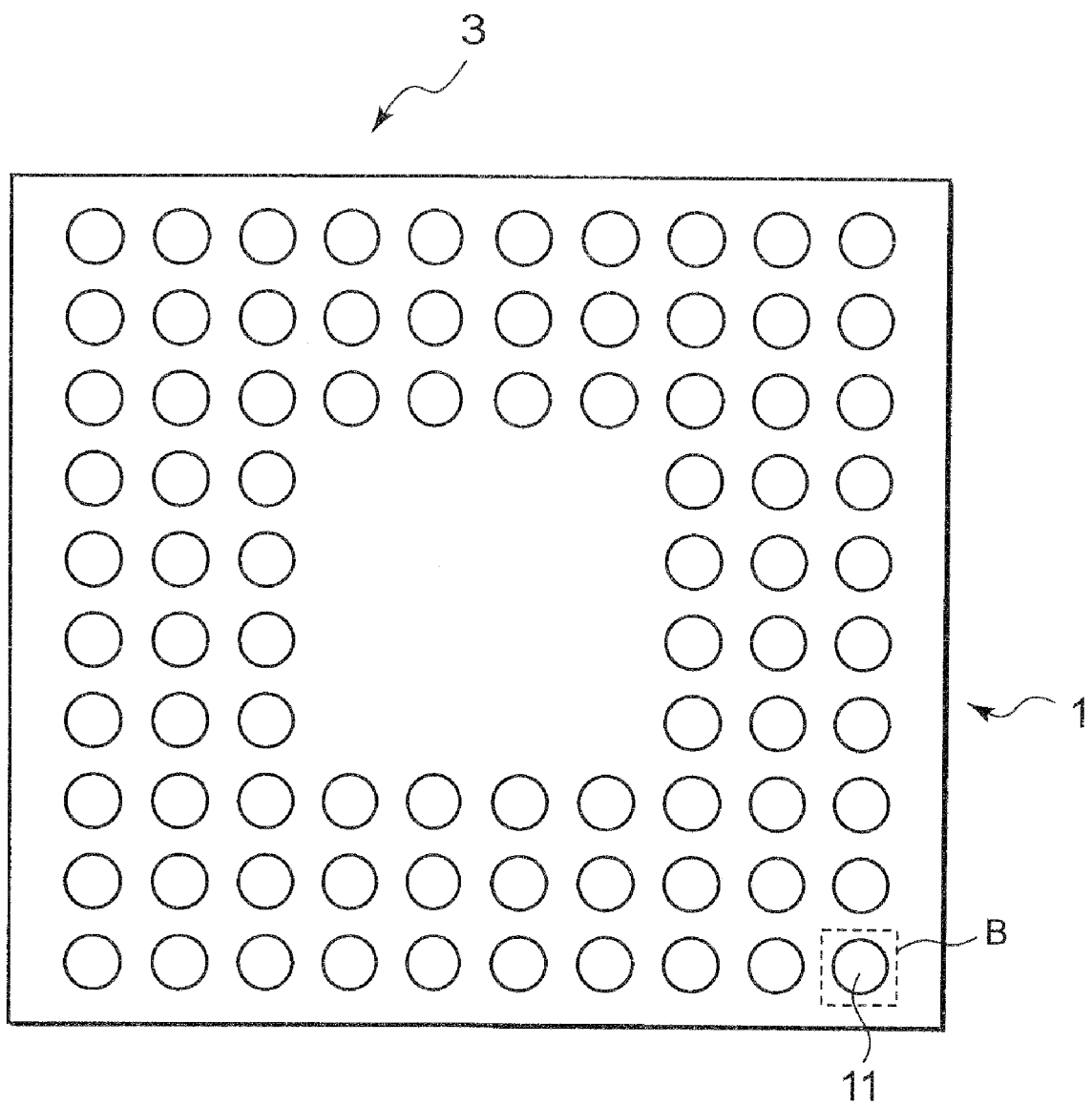
FIG. 2 is a diagram as viewed in the direction of the arrow A in FIG. 1.

Referring to FIGS. 1 and 2, description will be made of a wiring board 1 according to a first exemplary embodiment of the present invention, and a schematic structure of a semiconductor device 3 including the wiring board 1.

As shown in FIGS. 1 and 2, the semiconductor device 3 has a plate-like wiring board 1 having a substantially rectangular shape in plan view, and a semiconductor chip 5. The shown semiconductor chip 5 is mounted on one face (first face) of the wiring board 1.

The semiconductor chip 5 has, on one face of a substrate made of a semiconductor chip material such as silicon or germanium, a logic circuit such as a microprocessor or a memory circuit such as a SRAM (Static Random Access Memory) or DRAM (Dynamic Random Access Memory).

Solder balls 11 are mounted on the other face (second face) of the wiring board 1 to serve as contact members for connecting the semiconductor device 3 with another device.

Referring to FIGS. 1 and 2, the structure of the wiring board 1 and the semiconductor device 3 will be described in more detail.

As shown in FIGS. 1 and 2, the wiring board 1 has a substrate 13, a solder resist 21a provided on one face (first face) of the substrate 13 on which the semiconductor chip 5 is mounted, a solder resist 21b provided on the other face (second face) of the substrate 13, lands 9 provided on the second face of the substrate 13, connection pads 15 provided on the first face of the substrate 13 on which the semiconductor chip 5 is mounted, and wiring lines 25 provided within and on the second face of the substrate 13.

More specifically, the substrate 13 of the wiring board 1 is made of a glass epoxy composite or the like, and the connection pads 15 are provided in plurality in the vicinity of the outer periphery on one face of the substrate 13.

The solder resist 21a provided on the first face of the substrate 13 on which the semiconductor chip 5 is mounted is arranged in a region except the region where the connection pads 15 are formed.

The semiconductor chip 5 is provided on the solder resist 21a with an adhesive agent 23 made of an insulating material interposed therebetween.

A plurality of electrode pads 19 are provided on the surface of the semiconductor chip 5 to be connected to the connection pads 15. The connection pads 15 and the electrode pads 19 are electrically connected to each other through wires 17 made of Au, Cu, Al or the like.

A passivation film (not shown) for protecting the circuit formation face is formed on the surface of the semiconductor chip 5 excluding the regions where the electrode pads 19 are formed.

Further, a sealing portion 7 is provided to cover at least the semiconductor chip 5, the connection pads 15, the electrode pads 19, and the wires 17.

The sealing portion 7 is made of an insulating thermoset resin such as an epoxy resin, and protects the semiconductor chip 5, and electrical connection parts including the connection pads 15, the electrode pads 19, and the wires 17.

As shown in FIG. 2, the lands 9 provided on the second face of the substrate 13 are arranged in a plurality at predetermined intervals to form a lattice pattern. The lands 9 are electrically connected to the connection pads 15 through wiring lines 25 (not shown in FIG. 1) provided in the inside of and on the surface of the substrate 13.

This means that the lands 9 are electrically connected to the electrode pads 19 on the semiconductor chip 5 through the wiring lines 25 and connection pads 15.

The solder resist 21b is provided on the second face of the substrate 13 so as not to be in contact with the lands 9, as described later. The solder balls 11 functioning as contact members are provided on the respective lands 9.

The solder balls 11 electrically connect the semiconductor chip 5 to another device through the wiring lines 25 by being connected with lands or other connection parts of this other device.

Figure 3:
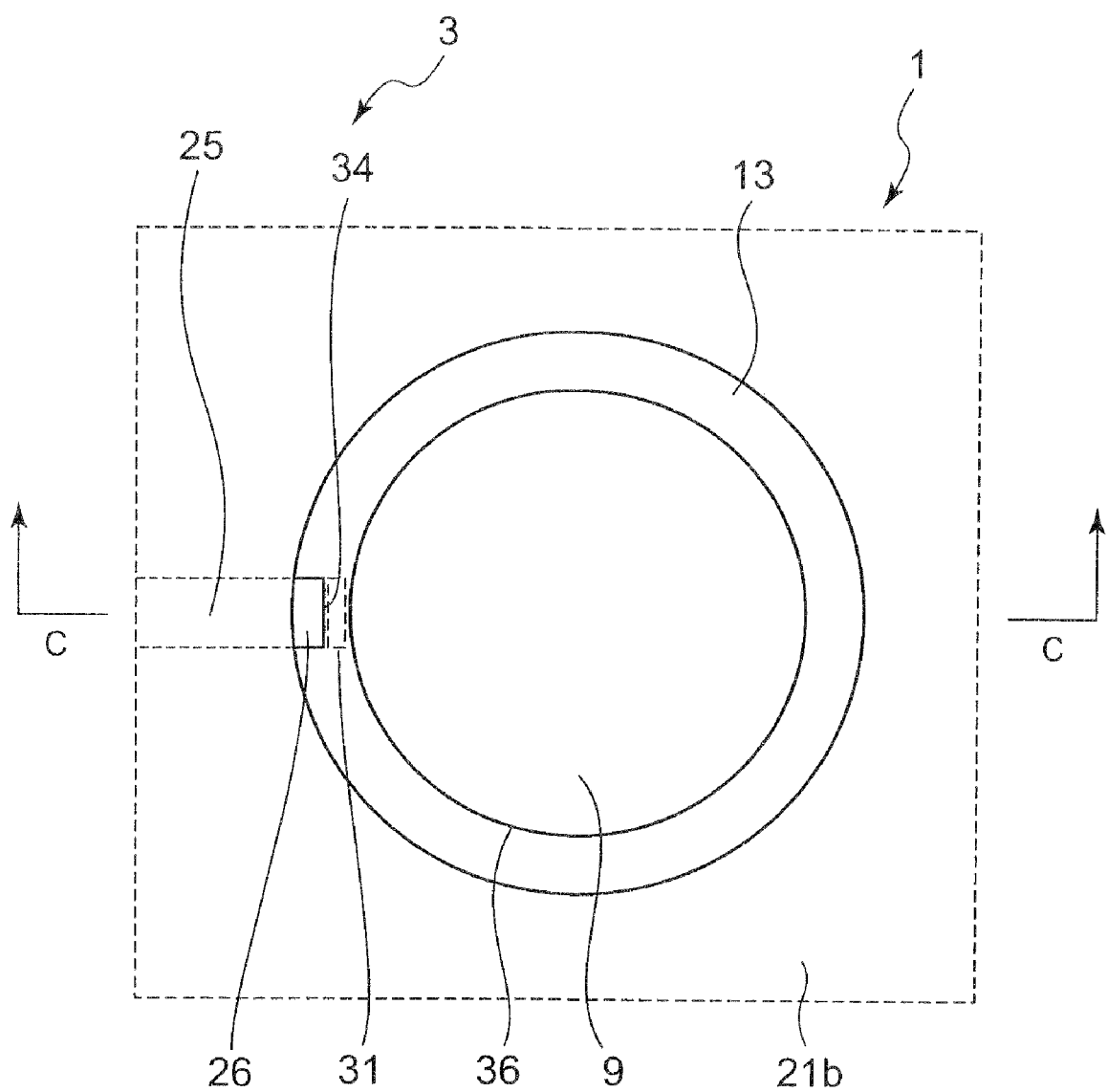
FIG. 3 is an enlarged view of a region B in FIG. 2, in which illustration of solder balls 11 is omitted and a part of a wiring line 25 covered with a solder resist 21b is represented by the dotted line.
Figure 4:
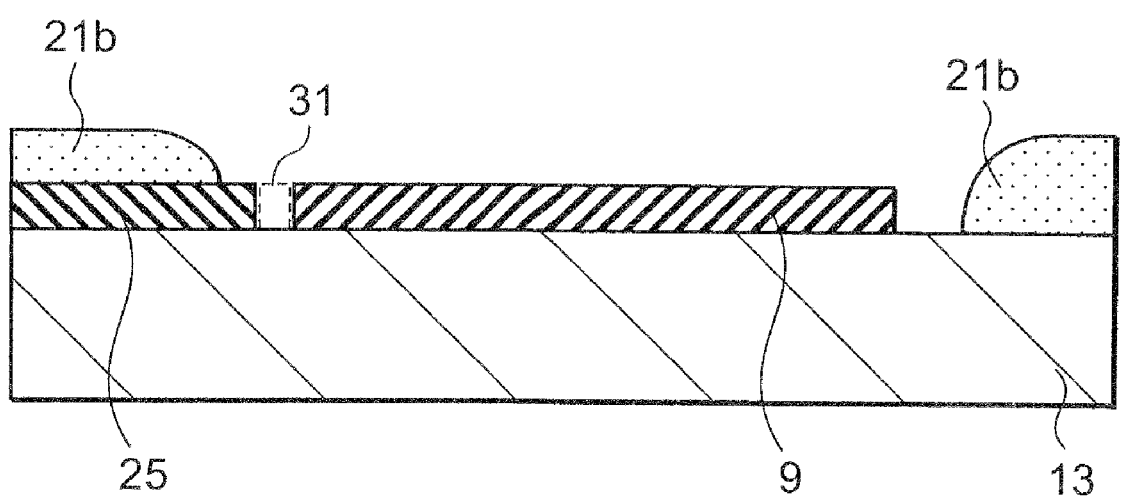
FIG. 4 is a cross-sectional view taken along the line C-C in FIG. 3.
Figure 5:
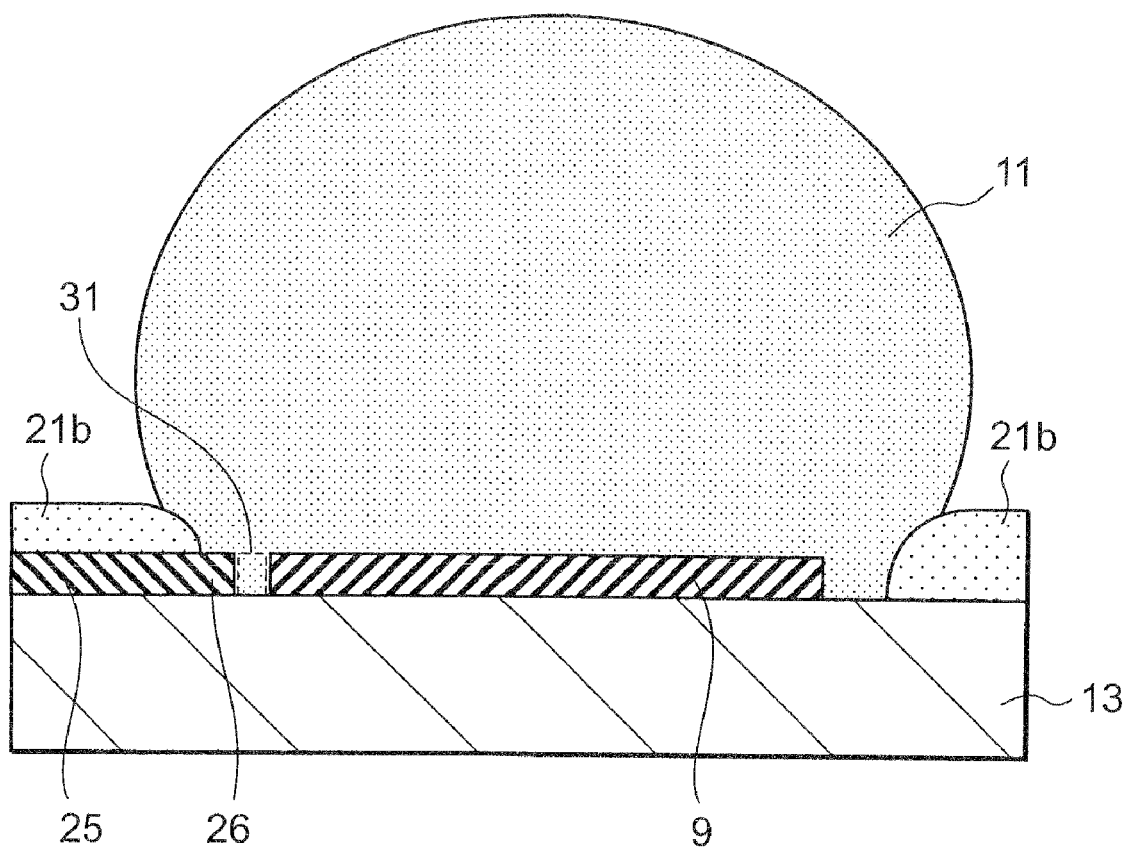
FIG. 5 is a cross-sectional view taken along the line C-C similar to FIG. 4 but including a solder ball 11.

Referring to FIGS. 3 to 5, description will be made of a configuration around the lands 9 of the wiring board 1.

As described later, the lands 9 and the wiring lines 25 are formed by etching a thin film of a conductor such as Cu into a pattern form as desired. In the first embodiment, the lands 9 are formed in a substantially circular shape, as shown in FIG. 3.

The surface of the substrate 13 (see FIG. 1) is mostly covered with the solder resist 21b.

As seen from the cross-sectional views of FIGS. 4 and 5 showing a region around one of the lands 9, the solder resist 21b is not in contact with the land 9, and a so-called NSMD (Non Solder Mask Defined) structure is formed.

On the other hand, as shown in FIGS. 3 and 4, the wiring line 25 has an end portion 26 arranged adjacent to the land 9, and the end portion 26 is not in contact with the solder resist 21b.

An outer peripheral edge 34 constituting a part of the outer periphery of the end portion 26 is arranged to face the outer periphery 36 of the land 9.

In the state as shown in FIGS. 3 and 4 in which no solder ball 11 is provided, the end portion 26 is spaced apart from the land 9, and a gap 31 is formed between the land 9 and the end portion 26.

This means that, the land 9 and the wiring line 25 are not electrically connected in the state as shown in FIGS. 3 and 4.

When a solder ball 11 is provided on the land 9, as shown in FIG. 5, the solder ball 11 covers the end portion 26 and the land 9 while the gap 31 is filled with the solder ball 11, whereby the end portion 26 and the land 9 are electrically connected to each other through the solder ball 11. In addition, the solder ball 11 and the wiring line 25 are also electrically connected to each other.

As described above, when the wiring board 1 has no solder balls 11 provided thereon, the lands 9 and the end portions 26 are not in contact with each other, and the lands 9 each assume a perfect NSMD (Non Solder Mask Defined) structure including no so-called "neck portion".

This allows the solder balls 11 to completely cover the side faces of the lands 9 and makes the solder balls 11 difficult to be separated from the lands 9. As a result, an ideal bond strength can be expected.

In other words, the packaging reliability of the semiconductor device 3 can be improved.

Further, the structure as described above is not affected by the arrangement of the board wiring and the lands. Therefore, the wiring board of the invention is applicable even to a product having a wiring board and lands according to a prior art, without changing the arrangement of the board wiring and the lands, but with a slight design alteration.

Referring to FIGS. 6 to 10, description will be made of a manufacturing process of the semiconductor device 3 including the wiring board 1 described above.

The semiconductor device 3 is manufactured by firstly fabricating a wiring motherboard 35 including a plurality of wiring boards 1, and then arranging semiconductor chips 5 or the like on the wiring motherboard 35.

Figure 6:
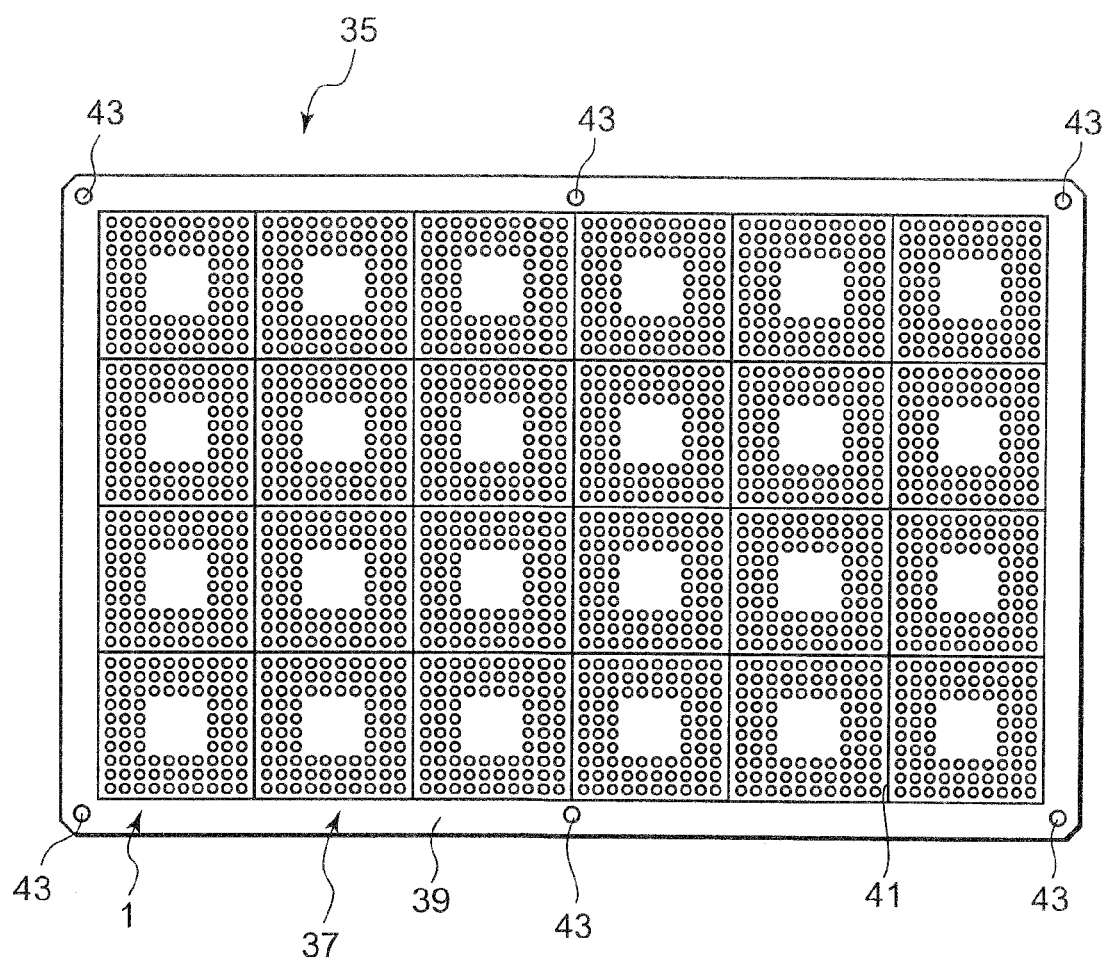
FIG. 6 is a plan view showing a wiring motherboard 35.

Referring to FIGS. 6 to 8, description will be made of procedures for fabricating the wiring motherboard 35.

Description will be first made of a configuration of the wiring motherboard 35 with reference to FIG. 6.

As shown in FIG. 6, the wiring motherboard 35 has a plurality of rectangular product formation areas 37.

The product formation areas 37 are arranged in matrix, and dicing lines 41 are formed between the product formation areas 37 so that the wiring motherboard 35 can be cut out along these lines.

The wiring boards 1 are each formed by performing predetermined processing steps (formation of the lands 9 and solder resist 21b) on the product formation area 37 as described later.

A frame 39 is formed around the product formation areas 37, so that this frame 39 is brought into contact with a conveyance device when the wiring motherboard 35 is transported.

The formation of the frame 39 makes it possible to transport the wiring motherboard 35 without the product formation areas 37 being directly touched.

The frame 39 is provided with a plurality of positioning holes 43 to be used for positioning during transportation.

Description will next be made of procedures for fabricating the wiring motherboard 35 with reference to FIGS. 6 to 8.

A substrate 13 made of a glass epoxy composite or the like is prepared and shaped into the same planar shape as that of the wiring motherboard 35 (FIG. 6).

Figure 7A:
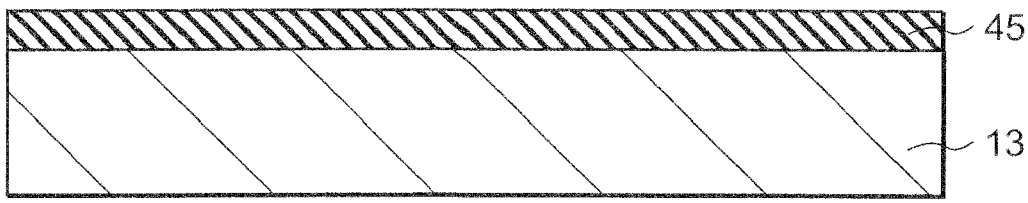
FIGS. 7A to 7D are diagrams showing procedural steps for fabricating the wiring motherboard 35.

Next, as shown in FIG. 7A, a copper layer 45 for forming lands 9 and wiring lines 25 is pasted on the substrate 13.

Figure 7B:
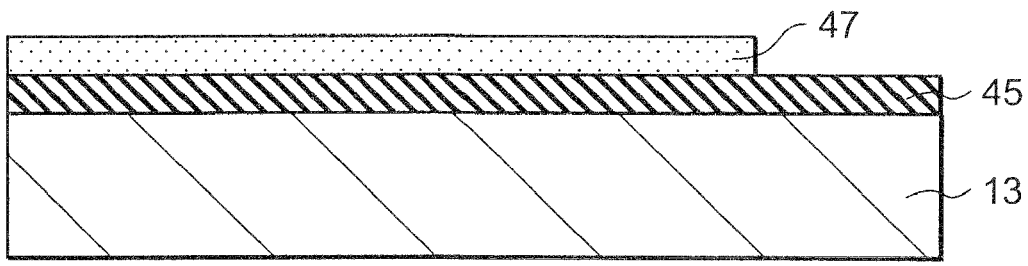

A photo resist 47 serving as a resist film is applied on the surface of the copper layer 45, and then the applied photo resist 47 is patterned as shown in FIG. 7B such that the photo resist 47 is removed, except for the regions where the lands 9 are to be formed, to expose the copper layer 45.

Figure 7C:
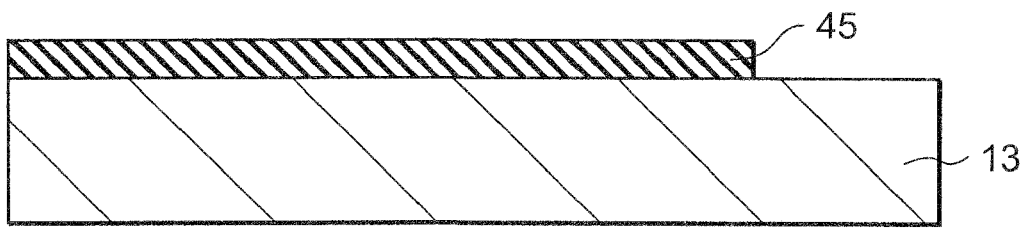

Further, the exposed part of the copper layer 45 is partially etched away, as shown in FIG. 7C, to leave the part of the copper layer 45 for forming the lands 9 and the wiring lines 25.

Figure 7D:
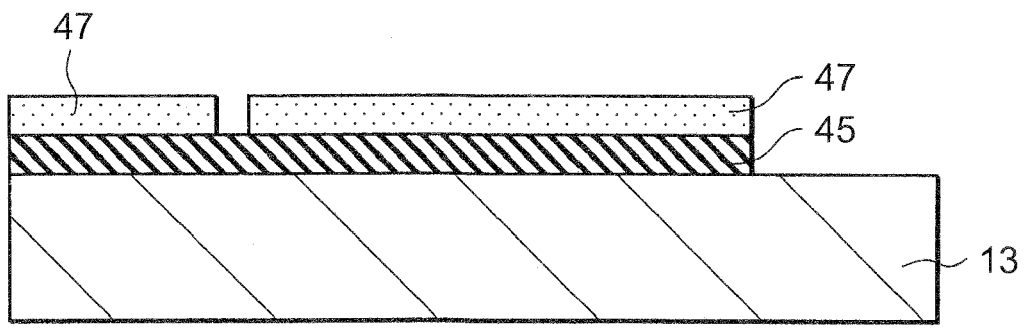

The photo resist 47 is again applied on the copper layer 45, and patterned into a desired shape while leaving the part of the photo resist 47 where the lands 9 and the wiring lines 25 are to be formed, as shown in FIG. 7D.

Figure 8A:
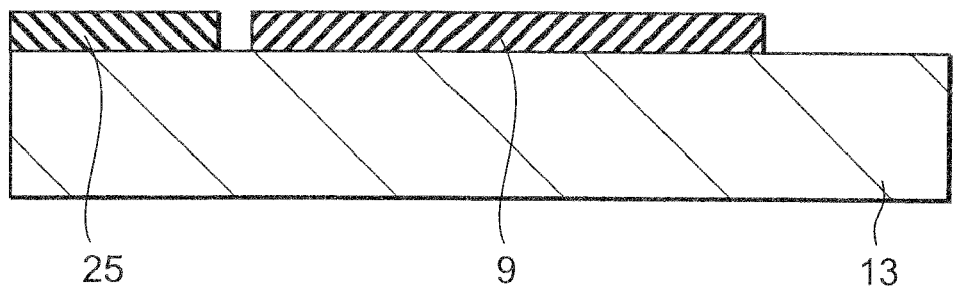
FIGS. 8A to 8C are also diagrams showing procedural steps for fabricating the wiring motherboard 35.

Next, as shown in FIG. 8A, the copper layer 45 is selectively etched away to form the lands 9 and the wiring lines 25, and then the remaining photo resist 47 is removed.

The wiring lines 25 and lands 9 are formed on the substrate 13 by the steps described above.

Figure 8B:
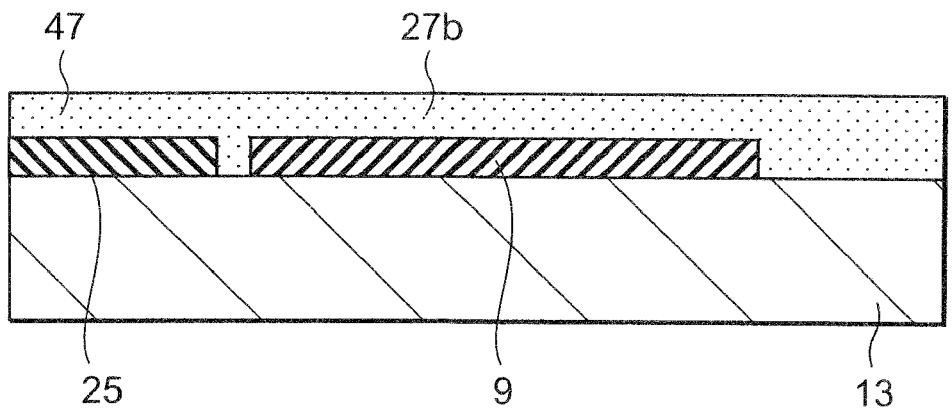

After formation of the lands 9, an ultraviolet curing solder resist 21b is applied all over the substrate 13, the wiring lines 25 (end portions 26) and the lands 9 as shown in FIG. 8B.

After completing the application of the solder resist 21b, only the part of the solder resist 21b to be left is caused to cure by being irradiated with ultraviolet rays.

The solder resist 21b is not in contact with the end portions 26 of the wiring lines 25 or the lands 9.

Therefore, no ultraviolet rays are applied to the end portions 26 of the wiring lines 25, the lands 9, and peripheries of the lands 9.

After being irradiated with ultraviolet rays, the substrate 13 and the lands 9 are entirely cleaned to remove the uncured part of the solder resist 21b. As a result, a structure as shown in FIG. 8C is obtained.

Figure 8C:
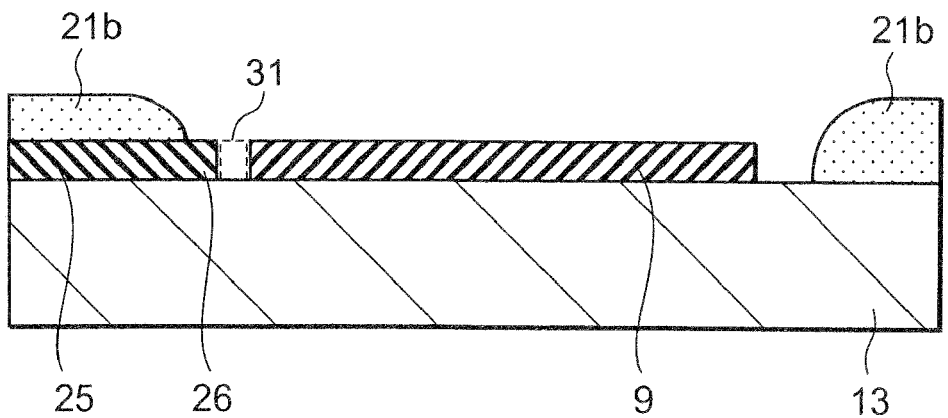

As shown in FIG. 8C, the solder resist 21b is not in contact with the lands 9, and the end portions 26 of the wiring lines 25 are not in contact with the solder resist 21b or the lands 9, either.

Therefore, the lands thus formed assume a perfect NSMD (Non Solder Mask Defined) structure.

Subsequently, if required, a solder resist 21a and connection pads 15 as shown in FIG. 1 are formed on the opposite face of the substrate 13, while wiring lines 25 are provided within the substrate 13 to connect between the connection pads 15 and the lands 9, and thus the wiring motherboard 35 is completed.

The surfaces of the lands 9 and the connection pads 15 are plated, if required, so that the plated layer provides anti-oxidation and barrier effects.

Referring to FIGS. 9 and 10, description will be made of procedures for manufacturing a semiconductor device 3 by arranging semiconductor chips 5 on the wiring motherboard 35.

Figure 9A:
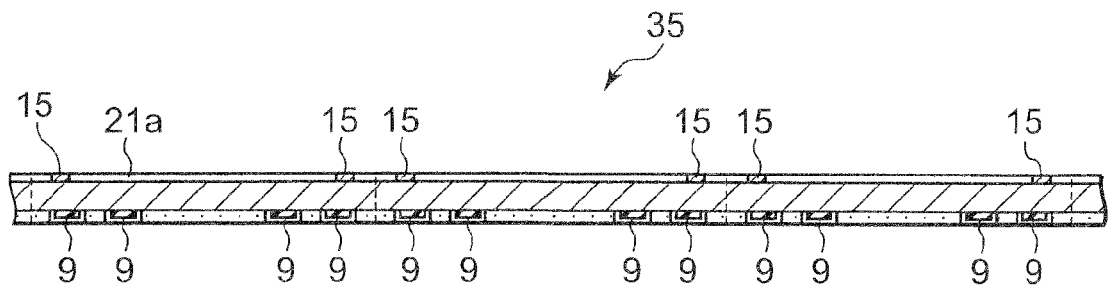
FIGS. 9A to 9C are diagrams showing procedural steps for manufacturing the semiconductor device 3 using the wiring motherboard 35.

First, as shown in FIG. 9A, the wiring motherboard 35 is placed on a chip mounter (not shown) with the connection pads 15 facing up.

Figure 9B:
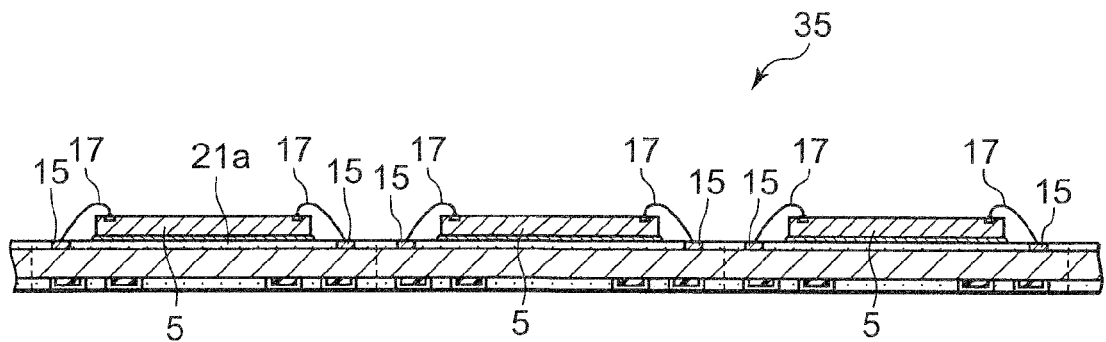

Upon completion of the placement of the wiring motherboard 35, as shown in FIG. 9B, semiconductor chips 5 are mounted on the wiring motherboard 35 via an adhesive by the chip mounter (not shown). The adhesive is then cured by application of heat, whereby the chip mounting is completed.

Upon completion of the mounting of the semiconductor chips 5, the wiring motherboard is mounted on a wire bonder (not shown).

The wire bonder connects an end of each wire 17 to an electrode pad 19 (see FIG. 1) by ultrasonic thermocompression bonding, and then connects the other end onto a connection pad 15 by ultrasonic thermocompression bonding such that the wire forms a predetermined loop shape.

Subsequently, the wiring motherboard 35 having the semiconductor chips 5 mounted thereon is placed on a mold machine (not shown).

Upon completion of the placement of the wiring motherboard 35, the wiring motherboard 35 is clamped between the upper and lower molds of the mold machine (not shown). In this clamped state, a molten sealing resin such as thermosetting epoxy resin is injected between the upper and lower molds and cured.

Figure 9C:
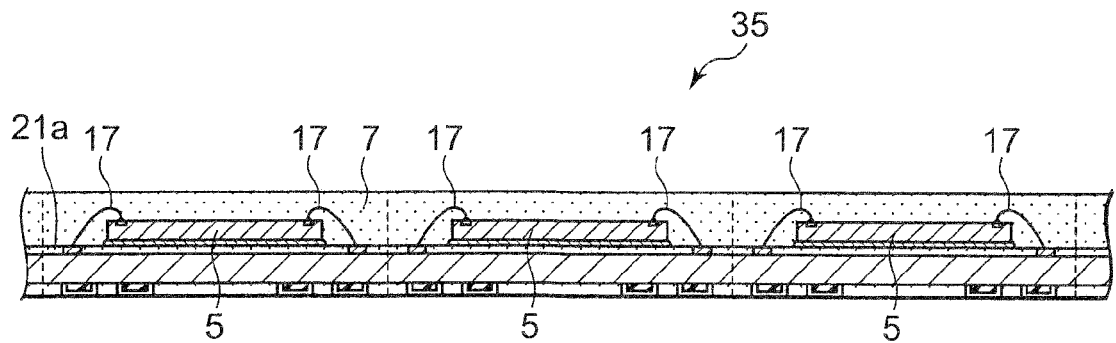

Thus, the sealing resin is thermally cured and, as shown in FIG. 9C, a sealing portion 8 collectively covering a plurality of product formation areas 37 (see FIG. 6) is formed. The use of the collective molding enables efficient formation of the sealing portion 7.

Subsequently, the wiring motherboard 35 is placed on a ball mounter (not shown) with the lands 9 facing up.

Figure 10A:
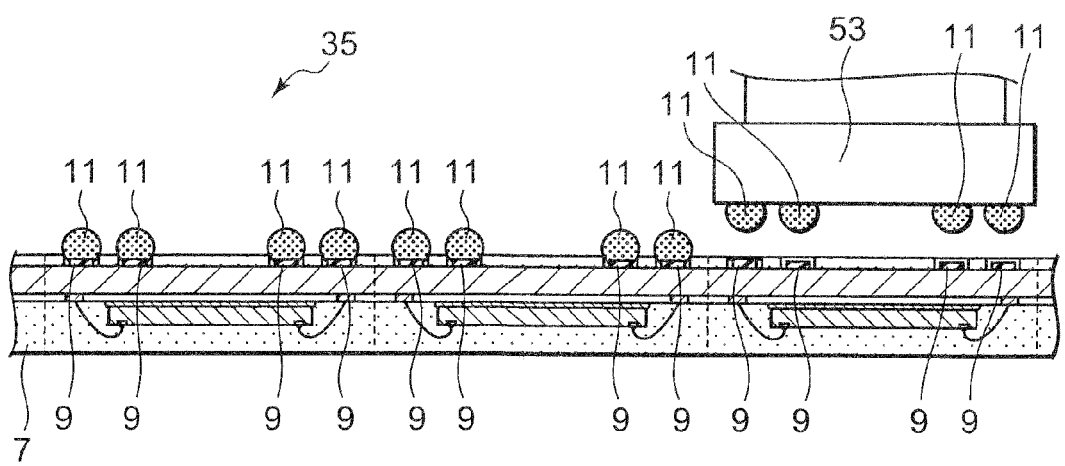
FIGS. 10A and 10B are also diagrams showing procedural steps for manufacturing the semiconductor device 3 using the wiring motherboard 35.

Upon completion of the placement of the wiring motherboard 35, as shown in FIG. 10A, solder balls 11 are vacuum-held by a mount tool 53 of the ball mounter, for example, and mounted on the respective lands 9 with flux interposed therebetween.

Subsequently, reflow is performed on the wiring motherboard 35, whereby the solder balls 11 are connected with the lands 9 and wiring lines 25.

In this manner, external terminals (contact members) are formed by the mounting of the solder balls 11 on the lands 9 of the wiring motherboard 35.

The wiring motherboard 35 is then placed on a dicing machine (not shown).

Figure 10B:
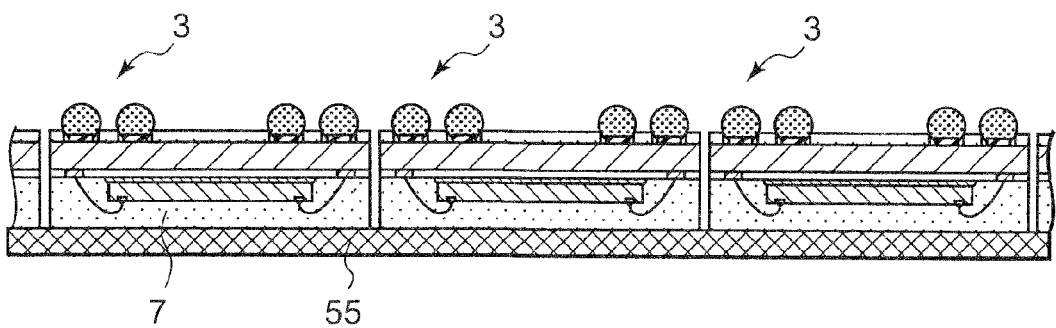

More specifically, as shown in FIG. 10B, the sealing portion 7 is fixedly pasted to a dicing tape 55.

Subsequently, the fixedly pasted wiring motherboard 35 is cut along the dicing lines 41 (see FIG. 6) and separated into individual product formation areas 37 (see FIG. 6) by means of a rotary dicing blade (not shown).

Finally, each of the separated individual product formation areas 37 is picked up from the dicing tape 55, whereby a semiconductor device 3 as shown in FIG. 1 can be obtained.

According to the first exemplary embodiment, as described above, the wiring board 1 of the semiconductor device 3 has the substrate 13, the solder resist 21b, the wiring lines 25, and the lands 9, and the lands 9 are not in contact with the solder resist 21b or the wiring lines 25, each assuming a perfect NSMD structure without a neck portion.

Therefore, this perfect NSMD structure allows the solder balls 11 to reach the side faces of the lands 9, whereby the bonding strength between the lands 9 and the solder balls 11 can be enhanced in comparison with the prior art. Thus, the fracture of the solder balls can be prevented and an ideal bond strength can be expected.

This means that the packaging reliability of the relevant semiconductor device 3 can be improved.

The end portions 26 of the wiring lines 25 exposed from the solder resist 21b are connected to the lands via the solder balls 11, which ensures electric conduction from the solder balls 11 and wiring lines 25 to the semiconductor chips 5.

The structure as described above is not affected by the arrangement of the board wiring and the lands. Therefore, the wiring board of the invention is applicable to products having conventional wiring board and land arrangement, without changing the arrangement of the board wiring and the lands, but with a slight design alteration.

An electronic device 101 according to a second exemplary embodiment of the invention will be described with reference to FIG. 11.

The electronic device 101 according to the second embodiment is obtained by mounting the semiconductor device 3 according to the first embodiment on a motherboard 65.

In the description of the second embodiment below, elements having the same functions as those of the first embodiment are assigned with the same reference numerals and description thereof is omitted.

Figure 11:
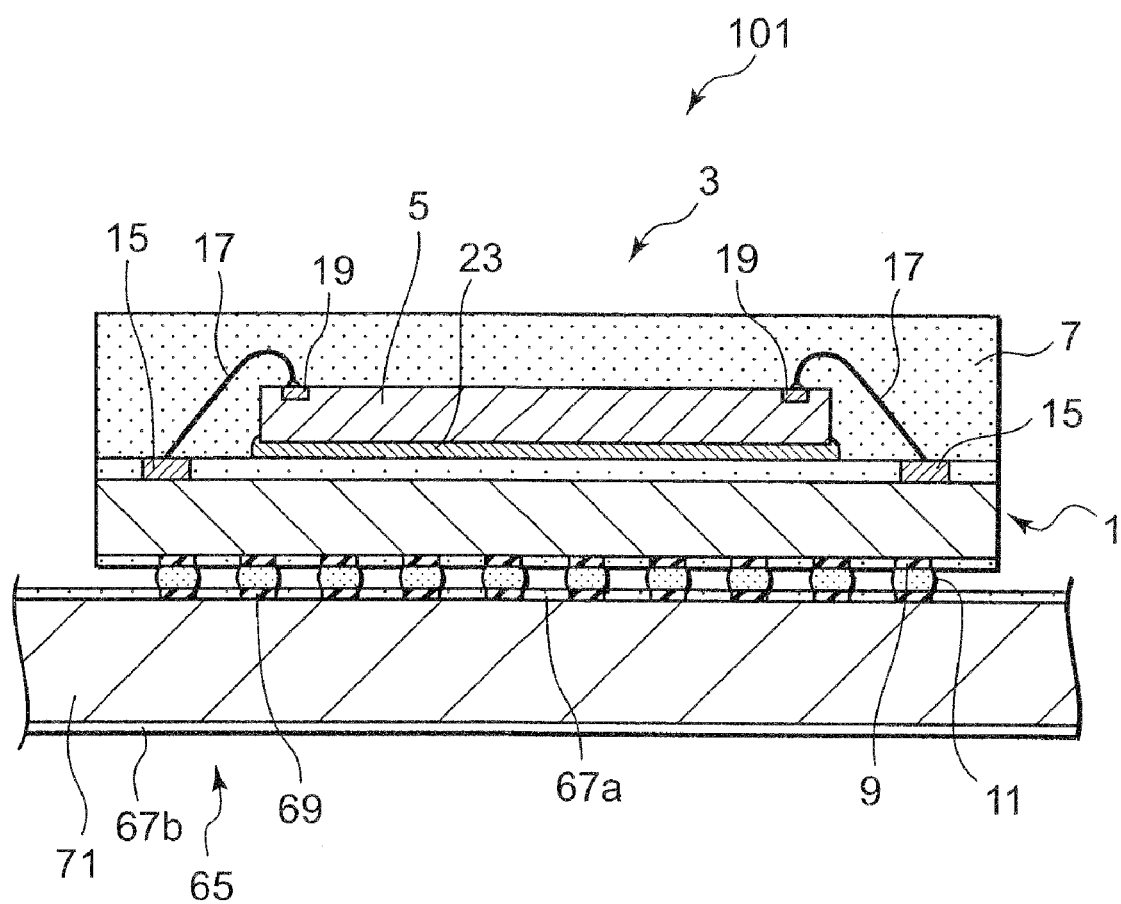
FIG. 11 is a cross-sectional view showing an electronic device 101.

As shown in FIG. 11, the electronic device 101 has a motherboard 65 and a semiconductor device 3.

The motherboard 65 has a substrate 71 made of a glass epoxy composite or the like, and a plurality of lands 69 are arranged at predetermined intervals to form a lattice pattern on one face, or a first face of the substrate 71. Wiring lines 70 (not shown) are also provided on the first face of the substrate 71.

Further, a solder resist 67a is provided on the first face of the substrate 71 except the lands 69 and part of the wiring lines 70, while a solder resist 67b is provided on the other face (second face) of the substrate 71.

The configuration of the solder resist 67a, the wiring lines 70 and the lands 69 is the same as that of the solder resist 21b, the wiring lines 25 and the lands 9 on the wiring board 1 of the semiconductor device 3.

In other words, the solder resist 67a is not in contact with the lands 69, forming a so-called NSMD (Non Solder Mask Defined) structure.

On the other hand, the solder resist 67a is not in contact with the end portions 72 of the wiring lines 70 (not shown), either. When the solder balls 11 and the lands 69 are not connected, the lands 69 and the end portions 72 are not in contact with each other but are spaced apart from each other.

Therefore, in the state in which the solder balls 11 and the lands 69 are not mutually connected, the lands 69 are not electrically connected to the wiring lines 70.

As shown in FIG. 11, the semiconductor device 3 is mounted on the motherboard 65 and the solder balls 11 are disposed on the respective lands 69. Thus, each of the solder balls 11 covers the end portion 72 and the land 69, whereby the wiring line 70 and the land 69 are electrically connected to each other through the solder ball 11.

This configuration allows the lands 69 to assume a perfect NSMD structure without a neck portion in the motherboard 65 as well. Therefore, the breakage of the solder balls 11 can be prevented and an ideal bond strength can be expected.

According to the second exemplary embodiment, as described above, the electronic device 101 has the motherboard 65 and the semiconductor device 3.

This means that the second embodiment provides beneficial effects equaling or surpassing those of the first embodiment.

A wiring board 1a according a third exemplary embodiment will be described with reference to FIG. 12.

The wiring board 1a according to the third exemplary embodiment is different from the first embodiment in that the width of the end portion 26a of each wiring line 25a is increased as it comes closer to the land 9a.

In the description of the third exemplary embodiment, elements having the same functions as those of the first embodiment are assigned with the same reference numerals and description thereof is omitted.

Figure 12:
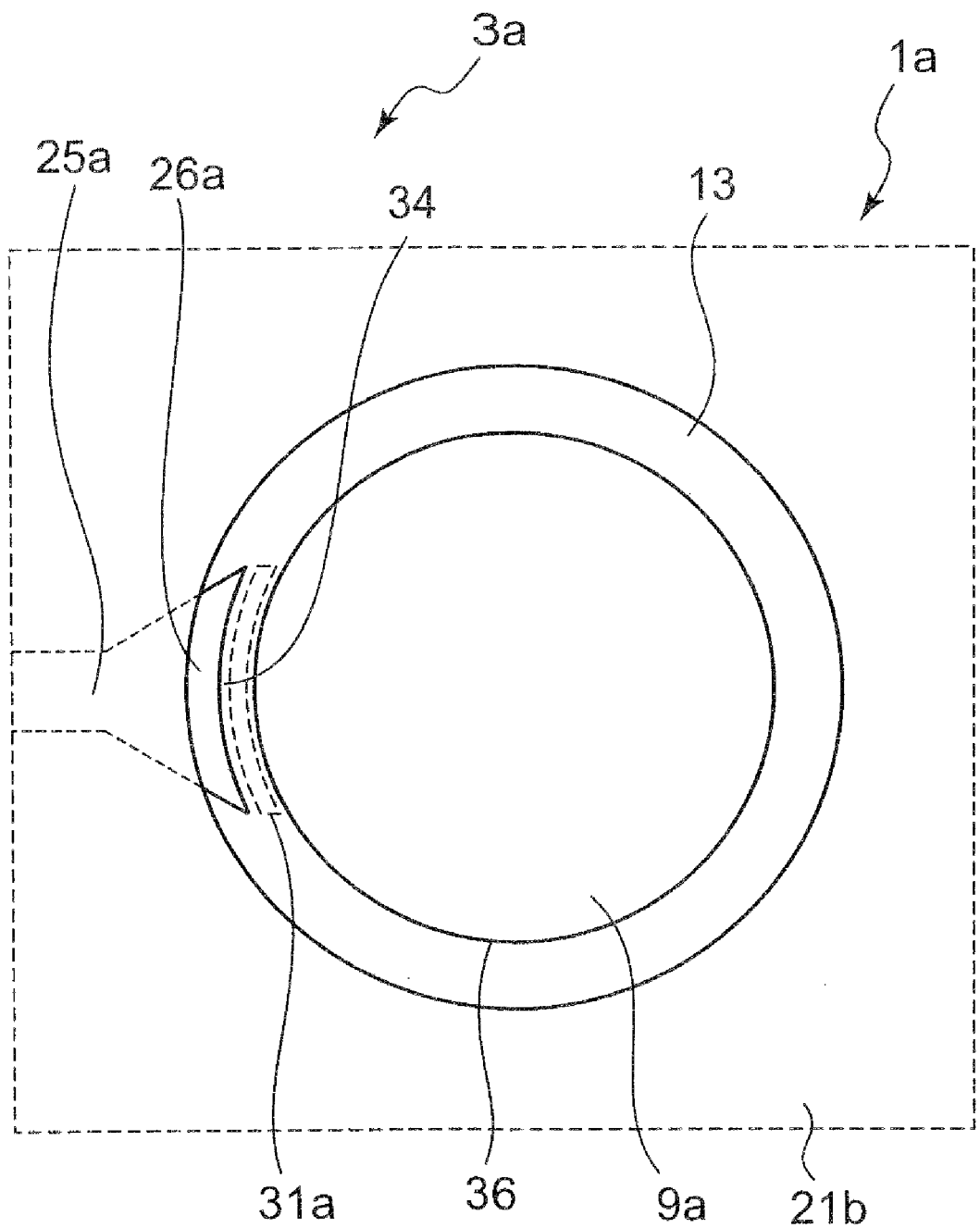
FIG. 12 is a plan view showing a wiring board 1a, in which illustration of solder balls 11 is omitted and a part of a wiring line 25a covered with solder resist 21b is represented by the dotted line.

As shown in FIG. 12, the width of the end portion 26a of the wiring line 25a is increased as it comes closer to the land 9a.

The end portion 26a has an outer peripheral edge 34 facing the outer periphery 36 of the land, and the outer peripheral edge 34 has a shape, in plan view, corresponding to that of the outer periphery 36 of the land (arc shape).

Thus, the increased width of the end portion 26a increases the contact area between the end portion 26a and the solder ball 11, in comparison with when the width is not enlarged. This ensures more reliable connected between the land 9a and the end portion 26a through the solder ball 11.

According to the third exemplary embodiment as described above, the wiring board 1a of the semiconductor device 3a has a substrate 13, a solder resist 21b, wiring lines 25a, and lands 9a, while the lands 9a are not contact with the solder resist 21b or the wiring lines 25a, each assuming a perfect NSMD structure without a neck portion.

This means that the third exemplary embodiment provides beneficial effects equivalent to those of the first exemplary embodiment.

Further, according to the third exemplary embodiment, the width of the end portion 26a of the wiring line 25a is increased as the end portion 26a comes closer to the land 9 such that it corresponds to the shape of the land 9a.

As a result, the contact area between the end portion 26a and the solder ball 11 is increased in comparison with the first exemplary embodiment, which therefore ensures more reliable connected between the end portion 26a and the land 9a through the solder ball 11.

A wiring board 1b according to a fourth exemplary embodiment will be described with reference to FIG. 13.

The wiring board 1b according to the fourth exemplary embodiment is different from the second exemplary embodiment in that the shape of the outer peripheral edge 34b of each end portion 26b assumes a wave pattern in plan view.

In the description of the fourth exemplary embodiment below, elements having the same functions as those of the first exemplary embodiment are assigned with the same reference numerals and description thereof is omitted.

Figure 13:
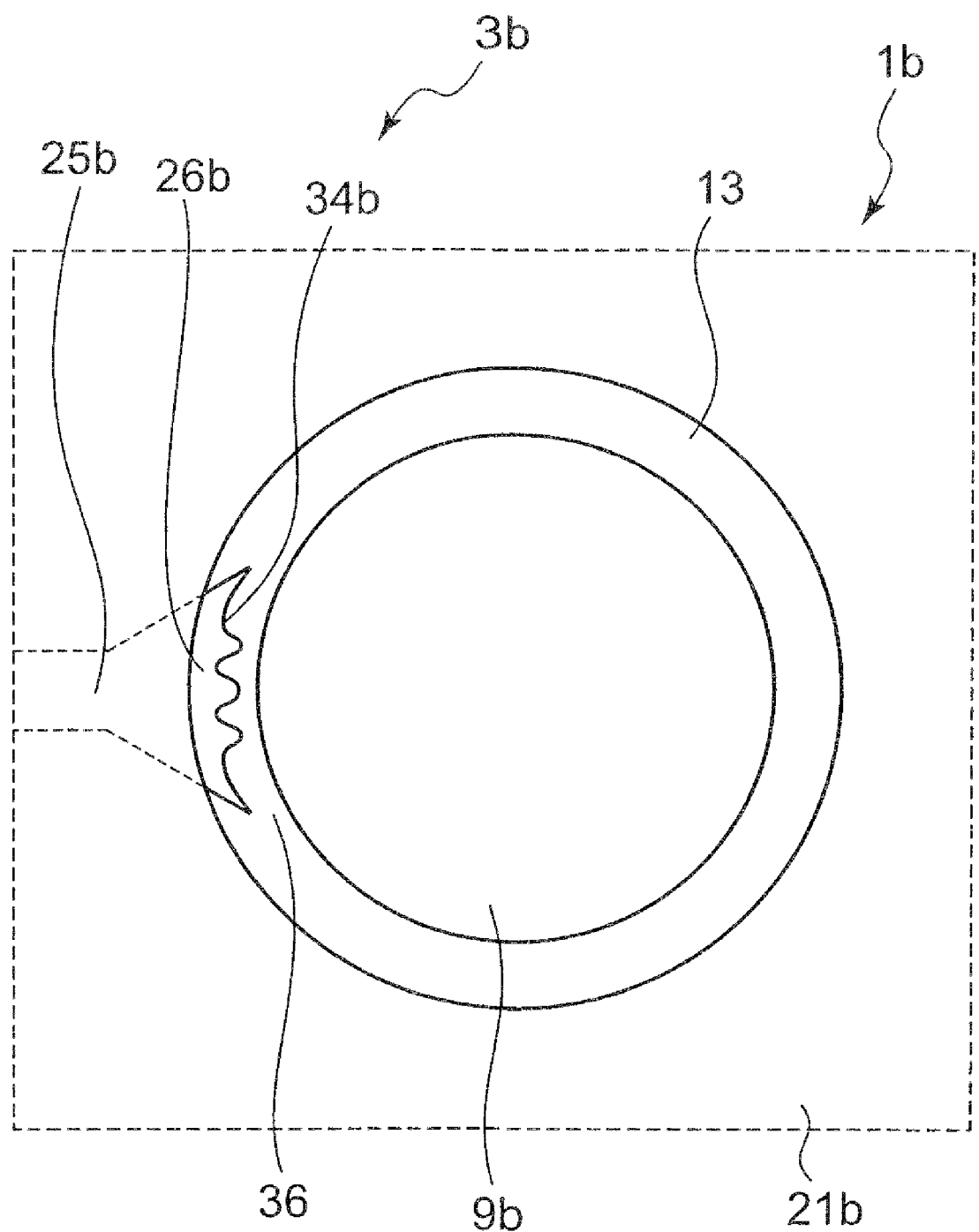
FIG. 13 is a plan view showing a wiring board 1b, in which illustration of solder balls 11 is omitted and a part of a wiring line 25b covered with a solder resist 21b is represented by the dotted line.

As shown in FIG. 13, the end portion 26b has an outer peripheral edge 34b facing the outer periphery 36 of the land 9b, while the outer peripheral edge 34b is formed such that its shape assumes a wave or sawtooth form in plan view.

This wave-shaped formation of the outer peripheral edge 34b further increases the contact area between end portion 26a and the solder ball 11 in comparison with the case in which it is not formed in a wave shape, which ensures more reliable connection between the land 9b and the end portion 26b through the solder ball 11.

According to the fourth exemplary embodiment as described above, the wiring board 1b of the semiconductor device 3b has a substrate 13, a solder resist 21b, wiring lines 25b, and lands 9b, and the lands 9b are not in contact with the solder resist 21b or the wiring lines 25b, each assuming a perfect NSMD structure without a neck portion.

Therefore, the fourth exemplary embodiment provides beneficial effects equivalent to those of the first exemplary embodiment.

Further, according to the fourth exemplary embodiment, the end portion 26b of the wiring line 25b is formed such that the shape of the outer peripheral edge 34 facing the outer periphery 36 of the land 9b assumes a wave form in plan view.

As a result, the contact surface between the end portion 26a and the solder ball 11 is further increased in comparison with the second exemplary embodiment, which ensures more reliable connection between the land 9b and the end portion 26a through the solder ball 11.

A wiring board 1c according to a fifth exemplary embodiment will be described with reference to FIG. 14.

The wiring board 1c according to the fifth exemplary embodiment is different from the second embodiment in that each land 9c is composed of a plurality of annular lands 40a, 40b, 40c, and a circular land 40d.

In the description of the fifth exemplary embodiment below, elements having the same functions as those of the first exemplary embodiment are assigned with the same reference numerals and description thereof is omitted.

Figure 14:
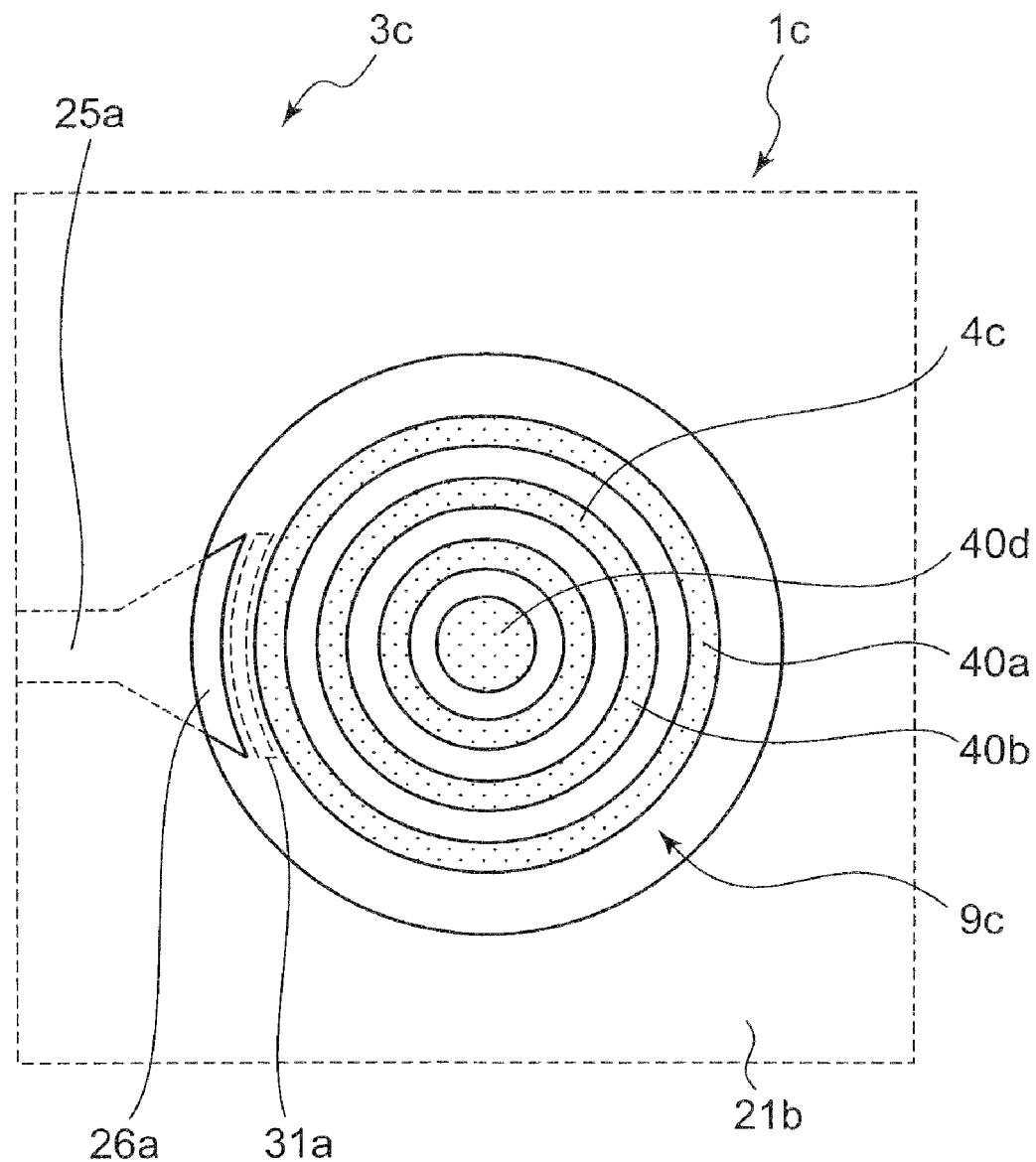
FIG. 14 is a plan view showing a wiring board 1c, in which illustration of solder balls 11 is omitted and a part of a wiring line 25a covered with a solder resist 21b is represented by the dotted line.

As shown in FIG. 14, the land 9c is composed of a plurality of annular lands 40a, 40b, 40c and a circular land 40d.

The annular lands 40a, 40b, 40c and the circular land 40d have mutually different radii, and are arranged concentrically while being radially spaced from each other.

The end portion 26a of the wiring line 25a is arranged to face the annular land 40a having a greatest radius.

This configuration of the land increases the contact area between the land 9c and the solder ball 11 in comparison when a single circular land is provided, resulting in improved bond strength between the land 9c and the solder ball 11.

According to the fifth exemplary embodiment as described above the wiring board 1d of the semiconductor device 3c has a substrate 13, a solder resist 21b, wiring lines 25c, and lands 9c, while the lands 9c are not contact with the solder resist 21b or the wiring lines 25c, each assuming a perfect NSMD structure without a neck portion.

Consequently, the fifth exemplary embodiment provides beneficial effects equivalent to those of the first exemplary embodiment.

Further, according to the fifth exemplary embodiment, each of the lands 9c is composed of a plurality of annular lands 40a, 40b, 40c and a circular land 40d.

This increases the contact area between the land 9c and the solder ball 11 in comparison with the second exemplary embodiment, resulting in improvement of bond strength between the land 9c and the solder ball 11.

A wiring board 1d according to a sixth exemplary embodiment will be described with reference to FIG. 15.

The wiring board 1d according to the sixth exemplary embodiment is different from the second embodiment in that the end portion of each wiring line 25d is branched into two or more portions, each of which faces the land 9d.

In the description of the sixth exemplary embodiment below, elements having the same functions as those of the first exemplary embodiment are assigned with the same reference numerals and description thereof is omitted.

Figure 15:
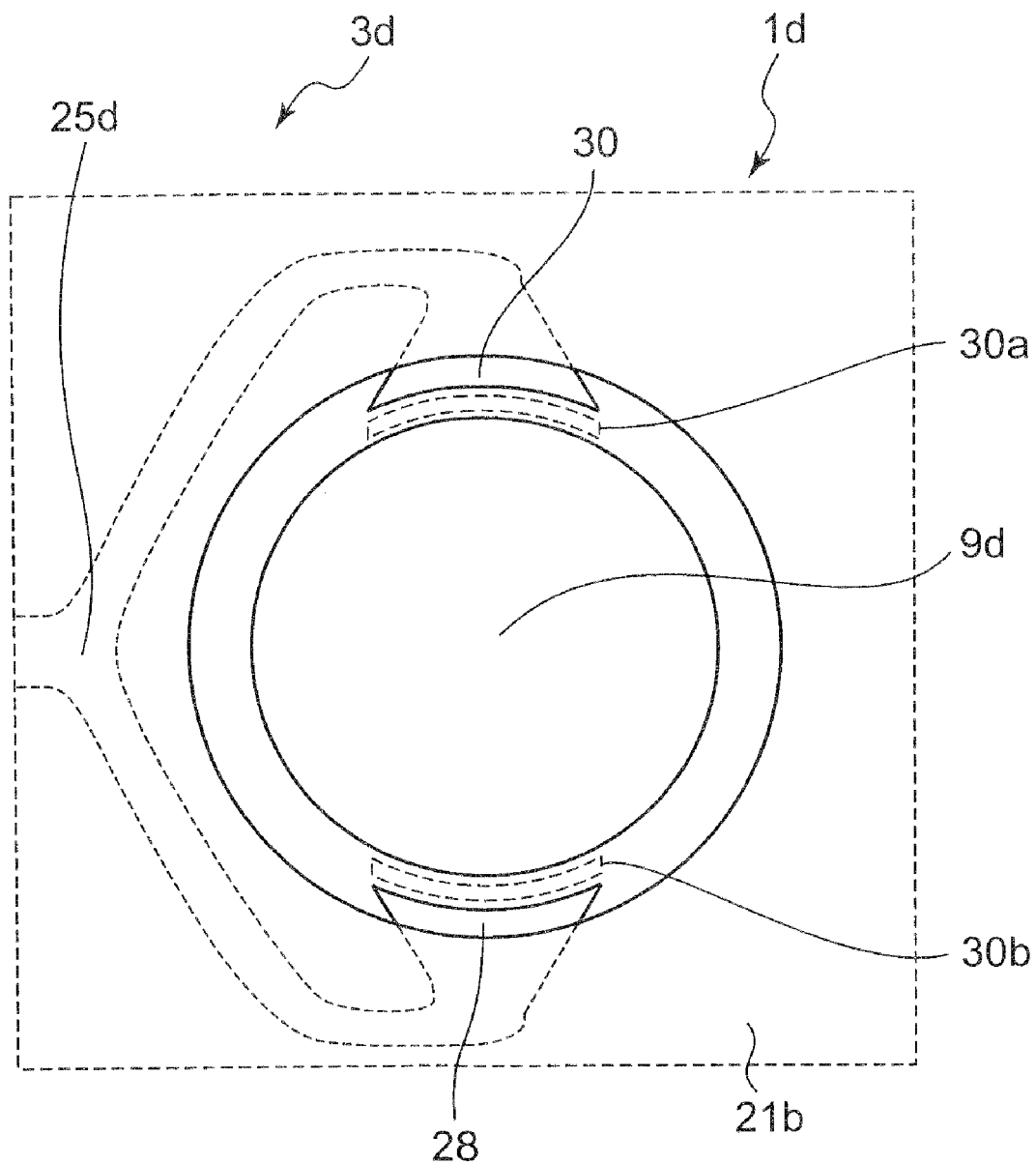
FIG. 15 is a plan view showing a wiring board 1d, in which illustration of solder balls 11 is omitted and a part of a wiring line 25c covered with a solder resist 21b is represented by the dotted line.

As shown in FIG. 15, the end portion of the wiring line 25d of the wiring board 1d is branched into two end portions 28 and 30.

Each of the end portions 28 and 30 has a peripheral edge arranged to face the land 9d, and gaps 30a and 30b are formed between the land 9d and the end portions 28 and 30, respectively.

The end portions 28 and 30 are arranged to face each other across the land 9d.

In this manner, the end portion of the wiring line 25c may be branched into a plurality of portions. This makes it possible to arrange the solder ball 11 in a balanced manner with the land 9d, and thus prevents defects due to a wiring connection error.

According to the sixth exemplary embodiment as described above, the wiring board 1d of the semiconductor device 3d has a substrate 13, a solder resist 21b, wiring lines 25d, and lands 9d, while the lands 9d are not in contact with the solder resist 21b or the wiring lines 25d, each assuming a perfect NSMD structure without a neck portion.

Thus, the sixth exemplary embodiment provides beneficial effects equivalent to those of the first exemplary embodiment.

Further, according to the sixth exemplary embodiment, the end portion of each wiring line 25c is branched into two end portions 28 and 30.

This makes it possible to arrange the solder ball 11 in a better balance with the land 9 in comparison with the second exemplary embodiment, and hence to prevent defects due to a wiring connection error.

A wiring board 1e according to a seventh exemplary embodiment will be described with reference to FIG. 16.

The wiring board 1e according to the seventh exemplary embodiment is different from the first embodiment in that each land 9e is provided with a cutout portion 75 and a part of the end portion 26e of each wiring line 25e is disposed within the cutout portion 75.

In the description of the seventh exemplary embodiment below, elements having the same functions as those of the first exemplary embodiment are assigned with the same reference numerals and description thereof is omitted.

Figure 16:
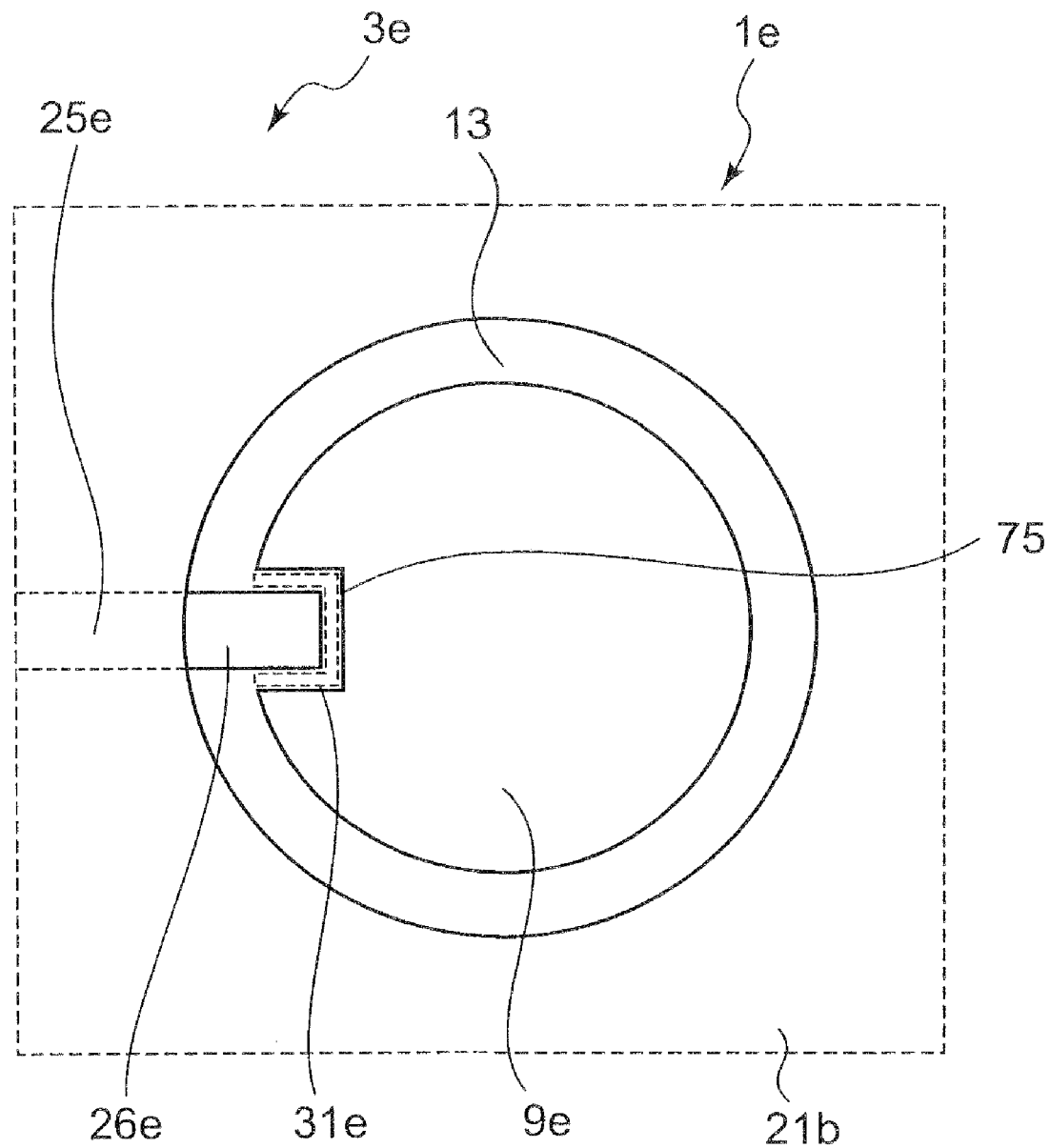
FIG. 16 is a plan view showing a wiring board 1e, in which illustration of solder balls 11 is omitted and a part of a wiring line 25e covered with a solder resist 21b is represented by the dotted line.

As shown in FIG. 16, the land 9e of the wiring board 1e is provided with a cutout portion 75 at a part of its outer periphery. The cutout portion 75 has a shape corresponding to the shape of the end portion 26e of the wiring line 25e.

The end portion 26e of the wiring line 25e is partially disposed within the cutout portion 75. In other words, the wiring line 25e is extended into the land 9e.

However, the land 9e is spaced apart from the end portion 26e within the cutout portion 75, and hence a gap 31e is created between the land 9e and the end portion 26e.

As described above, the cutout portion 75 may be provided in the outer periphery of the land 9e and a part of the end portion 26e may be arranged within the cutout portion 75.

This arrangement facilitates the connection between the wiring line 25e and the land 9 in comparison with when no cutout portion 75 is provided.

According to the seventh exemplary embodiment as described above, the wiring board 1e of the semiconductor device 3e has a substrate 13, a solder resist 21b, wiring lines 25e, and lands 9e, while the lands 9e are not in contact with the solder resist 21b or the wiring lines 25e, each assuming a perfect NSMD structure without a neck portion.

Therefore, the seventh exemplary embodiment provides beneficial effects equivalent to those of the first exemplary embodiment.

Further, according to the seventh exemplary embodiment, the cutout portion 75 is provided in the outer periphery of the land 9e, and a part of the end portion 26e is disposed within the cutout portion 75.

Therefore, according to the seventh exemplary embodiment, the connection between the wiring line 25e and the land 9e is made easier than in the first exemplary embodiment.

A wiring board 1f according to an eighth exemplary embodiment will be described with reference to FIG. 17.

The wiring board 1f according to the eighth exemplary embodiment is different from the first exemplary embodiment in that each of lands 9f is divided into a plurality of arcuate land portions 70a and 70b, and an end portion 26f of a wiring line 25f is disposed between the arcuate land portion 70a and the arcuate land portion 70b.

In the description of the eighth exemplary embodiment below, elements having the same functions as those of the first exemplary embodiment are assigned with the same reference numerals and description thereof is omitted.

Figure 17:
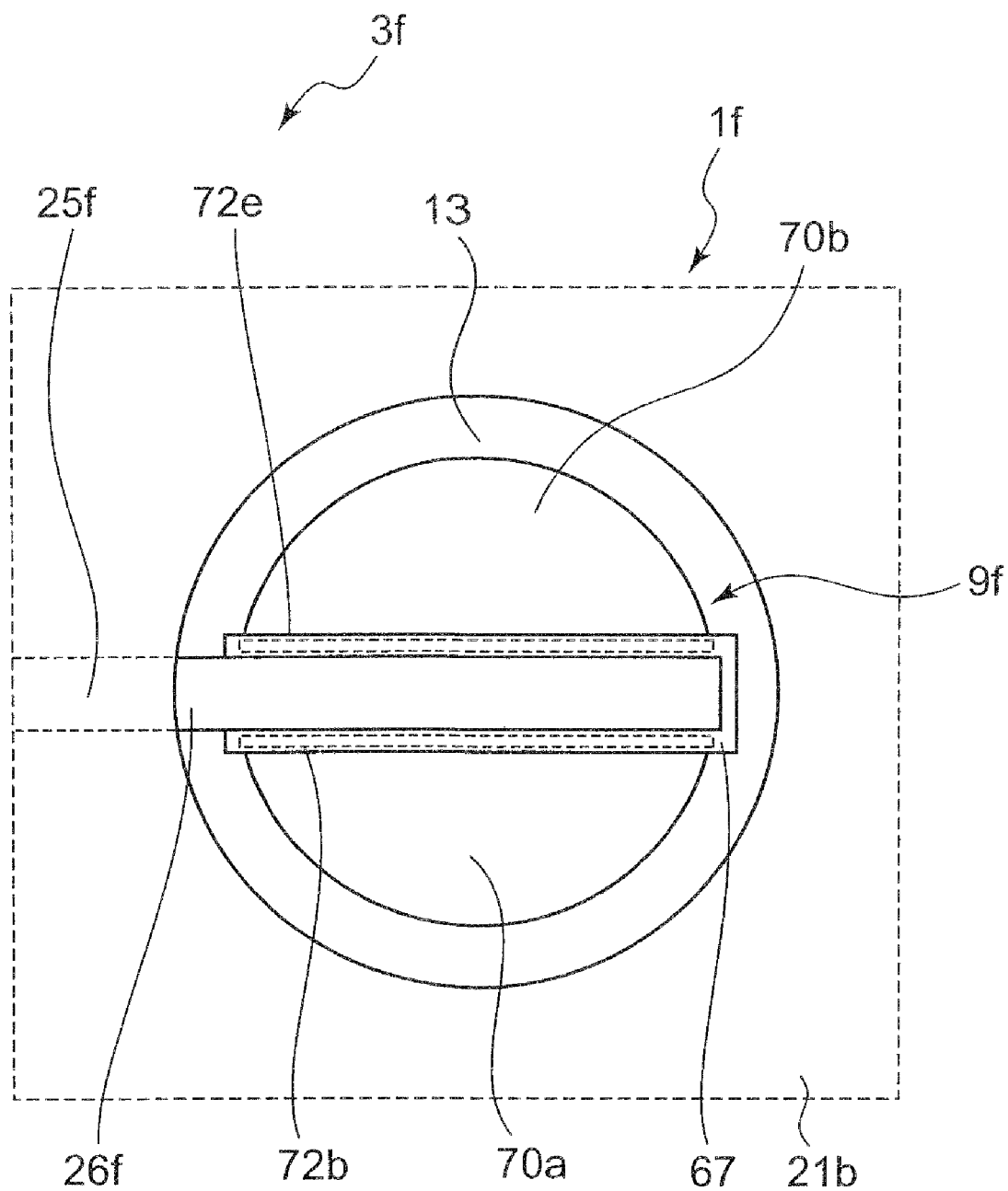
FIG. 17 is a plan view showing a wiring board 1f, in which illustration of solder balls 11 is omitted and a part of a wiring line 25f covered with a solder resist 21b is represented by the dotted line.

As shown in FIG. 17, the land 9f of the wiring board 1f is divided into arcuate land portions 70a and 70b, and the end portion 26f of the wiring line 25f is disposed between the arcuate land portions 70a and 70b.

The arcuate land portions 70a and 70b are spaced apart from the end portion 26f, so that gaps 72a and 72 are formed between the end portion 26f and the arcuate land portions 70a and 70b, respectively.

This means that, the wiring board 1f is characterized in that each of the lands 9f is divided into a plurality of arcuate land portions 70a and 70b, and the wiring line 25f is extended in between the arcuate land portions 70a and 70b.

Further, a through groove 67 is provided in the gaps 72a and 72b of the wiring board 1f to serve as an exhaust during formation of the solder ball 11.

In this manner, the land may be divided into a plurality of arcuate land portions 70a and 70b, and the wiring line 25f may be extended in between the arcuate land portions 70a and 70b.

This arrangement further facilitates the connection between the wiring line 25f and the land 9f.

Further, the provision of the through groove 67 in the gaps 72a and 72b still further facilitates the connection between the wiring line 25f and the land 9f.

According to the eighth exemplary embodiment as described above, the wiring board 1f of the semiconductor device 3f has a substrate 13, a solder resist 21b, wiring lines 25f, and lands 9f, while the lands 9f are not contact with the solder resist 21b or the end portions 26f of the wiring lines 25f, each assuming a perfect NSMD structure without a neck portion.

Accordingly, the eighth exemplary embodiment provides beneficial effects equivalent to those of the first exemplary embodiment.

Further, according to the eighth exemplary embodiment, each of the lands 9f is divided into arcuate land portions 70a and 70b, and the end portion 26f of the wiring line 25f is disposed between the arcuate land portions 70a and 70b.

This facilitates the connection between wiring line 25f and the land 9 compared to the first exemplary embodiment.

Further, according to the eighth exemplary embodiment, the through groove 67 is provided in the gaps 72a and 72b of the wiring board 1f to serve as an exhaust during formation of the solder ball 11.

This further facilitates the connection between wiring line 25f and the land 9 compared to the first exemplary embodiment.

A wiring board 1g according to a ninth exemplary embodiment will be described with reference to FIG. 18.

The wiring board 1g according to the ninth exemplary embodiment is different from the first exemplary embodiment in that a land 9g has a rectangular shape in plan view.

In the description of the ninth exemplary embodiment below, elements having the same functions as those of the first exemplary embodiment are assigned with the same reference numerals and description thereof is omitted.

Figure 18:
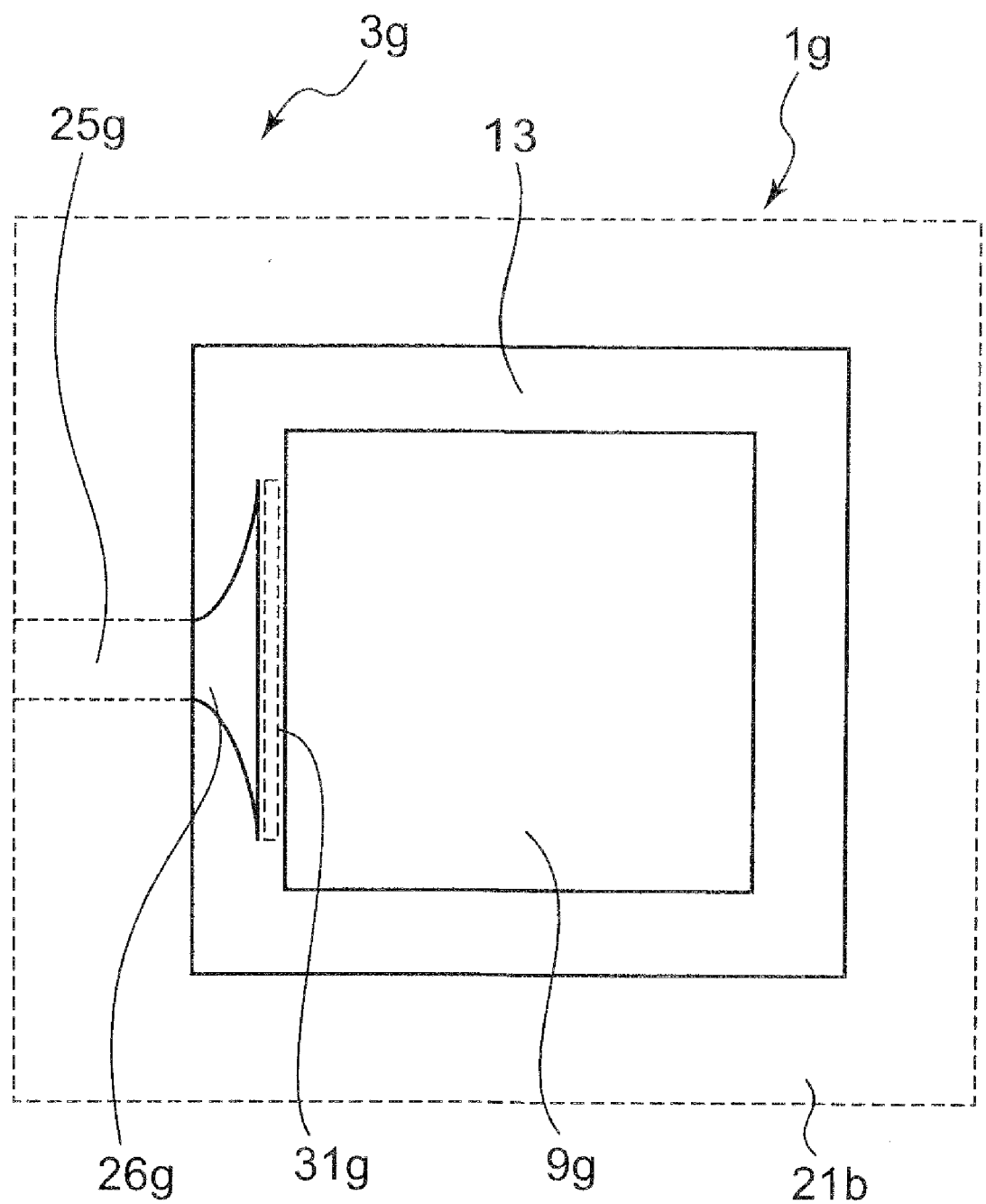
FIG. 18 is a plan view showing a wiring board 1g, in which illustration of solder balls 11 is omitted and a part of a wiring line 25g covered with a solder resist 21b is represented by the dotted line.

As shown in FIG. 18, the land 9g of the wiring board 1g has a rectangular shape in plan view.

In this manner, the shape in plan view of the land 9g is not limited to a circular shape but may be a rectangular shape.

According to the ninth exemplary embodiment as described above, the wiring board 1g of the semiconductor device 3g has a substrate 13, a solder resist 21b, wiring lines 25e, and lands 9e, while the lands 9e are not in contact with the solder resist 21b or end portions 26e of the wiring lines 25e, each assuming a perfect NSMD structure without a neck portion.

As a result, the ninth exemplary embodiment provides beneficial effects equivalent to those of the first exemplary embodiment.

Thus, the present invention provides a wiring board capable of enhancing the bonding strength between lands and contact members without changing the pitches, in comparison with that of conventional lands and contact members of the same size. The present invention also provides a semiconductor device having such a wiring board, a motherboard having characteristics of this wiring board, an electronic device in which a semiconductor device having this wiring board is mounted on a motherboard, and an electronic device in which various semiconductor devices or electronic components are mounted on a motherboard having characteristics of this wiring board.

Although the present invention has been described in conjunction with a few exemplary embodiments with a certain degree of particularity, the present invention is not limited to these embodiments but may be modified in various other manners within the spirit and scope as set out in the accompanying claims.

Although in the description of the embodiments above, the present invention is applied to a semiconductor device 3 or to a motherboard 65 on which the semiconductor device 3 is mounted, the present invention is not limited to these applications, but is applicable to any other structures which are required to be electrically connected with the use of a contact member.

What is claimed is:

1. A wiring board comprising:
   a substrate including a first surface;
   a land provided on the first surface of the substrate;
   a wiring line provided on the first surface of the substrate and including an end portion arranged adjacent to the land so as to form a gap between the land and the end portion; and
   a solder resist layer selectively provided on the first surface of the substrate, the solder resist layer including an opening to expose the land, the gap and the end portion of the wiring line.

2. The wiring board as claimed in claim 1, wherein the end portion has such a shape that a width thereof is increased toward the land.

3. The wiring board as claimed in claim 1, wherein a part of an outer periphery of the end portion facing an outer periphery of the land has a shape corresponding to the outer periphery of the land.

4. The wiring board as claimed in claim 1, wherein a part of an outer periphery of the end portion facing the outer periphery of the land has a wave or sawtooth shape in plan view.

5. The wiring board as claimed in claim 1, wherein the end portion of the wiring line is branched into a plurality of portions.

6. The wiring board as claimed in claim 1, wherein the land has a plurality of annular land portions having an annular shape in plan view, the plurality of annular land portions being arranged concentrically.

7. The wiring board as claimed in claim 1, wherein the land has a cutout portion, and
   at least a part of the wiring line is disposed within the cutout portion.

8. A semiconductor device, comprising:
   a substrate including a first surface and a second surface opposed to the first surface;
   a semiconductor chip mounted over the first surface of the substrate;
   a land provided on the second surface of the substrate;
   a wiring line provided on the second surface of the substrate, the wiring line being electrically coupled to the semiconductor chip, the wiring line including an end portion that is arranged adjacent to the land so as to form a gap between the land and the end portion; and
   a solder ball provided on the land and the end portion of the wiring line, the land being electrically coupled to the end portion of the wiring line via the solder ball.

9. The semiconductor device according to claim 8, further comprising:
   a solder resist layer selectively provided on the second surface of the substrate so that the land and the end portion of the wiring line are exposed from the solder resist layer.

10. The semiconductor device according to claim 8, wherein the solder ball is filling in the gap between the land and the end portion of the wiring line.

11. The semiconductor device according to claim 8, wherein the land includes a side surface, and
    the solder ball is covering the side surface of the land.

12. The semiconductor device according to claim 8, wherein the end portion of the wiring line has such a shape that a width thereof is increased toward the land.

13. The semiconductor device according to claim 8, wherein the end portion of the wiring line is branched into first and second end portions, each of the first and second portions are arranged adjacent to the land.

14. The semiconductor device according to claim 8, wherein the land includes a plurality of annular land portions having an annular shape in plan view, the plurality of annular land portions being arranged concentrically.

15. A semiconductor device, comprising:
    a substrate including a first surface and a second surface opposed to the first surface;
    first and second metal portions provided on the second surface of the substrate, the first and second metal portions being separated with each other;
    a semiconductor chip mounted over the first surface of the substrate, the semiconductor chip being electrically coupled to the second metal portion; and
    a contact member bridged between the first and second metal parts, the first metal portion being electrically coupled to the second metal portion via the contact member.

16. The semiconductor device according to claim 15, wherein a part of second metal portion is disposed adjacent to the first metal portion, the contact member being bridged between the first metal portion and the part of the second metal portion.

17. The semiconductor device according to claim 16, further comprising:
    a solder resist layer provided on the second surface of the substrate so that the first metal portion and the part of the second metal portion are exposed from the solder resist layer.

18. The semiconductor device according to claim 16, wherein the contact member is filling in a gap between the first metal portion and the part of the second metal portion.

19. The semiconductor device according to claim 15, wherein the first metal portion includes a side surface, and
    the contact member is covering the side surface of the first metal portion.

20. The semiconductor device according to claim 15, wherein the part of the second metal portion has such a shape that a width thereof is increased toward the first metal portion.

* * * * *